United States Patent [19]

Meyers et al.

[11] Patent Number: 4,719,355
[45] Date of Patent: Jan. 12, 1988

[54] ION SOURCE FOR AN ION IMPLANTER

[75] Inventors: Victor Meyers, Houston; Michael Relue, Sugarland, both of Tex.

[73] Assignee: Texas Instruments Incorporated, Dallas, Tex.

[21] Appl. No.: 850,181

[22] Filed: Apr. 10, 1986

[51] Int. Cl.$^4$ .............................................. H01J 27/00
[52] U.S. Cl. .................................. 250/425; 250/423 R
[58] Field of Search ............... 250/423 R, 423 F, 424, 250/425, 426, 427; 313/550, 564, 362.1; 60/202

[56] References Cited

U.S. PATENT DOCUMENTS

| 2,824,967 | 2/1958 | Kamen | 250/425 |
| 3,654,457 | 4/1972 | Yano et al. | 250/425 |
| 3,700,892 | 10/1972 | Bell, Jr. et al. | 250/425 |
| 3,789,253 | 1/1974 | Kervizic et al. | 313/550 |
| 4,112,137 | 9/1978 | Zega | 427/38 |

FOREIGN PATENT DOCUMENTS 0158839  9/1983  Japan .............................. 250/423 R Primary Examiner—Bruce C. Anderson
Assistant Examiner—Paul A. Guss
Attorney, Agent, or Firm—John G. Graham; Rodney M. Anderson

[57] ABSTRACT

An ion source of a type used on ion implanters which includes a crucible having a hollow interior and a hole for providing fluid communication between the interior of and exterior to the crucible. A heater assembly is used for adjustably heating the crucible. The crucible hole is if fluid communication with a passageway down the crucible and with a vapor nozzle aperture. An arc chamber has an inlet positioned at the output of the vapor nozzle aperture. The material to be vaporized does not bond to the crucible interior when solidified from a liquid state.

7 Claims, 3 Drawing Figures

ION SOURCE FOR AN ION IMPLANTER

BACKGROUND

The present invention relates to an ion source used in an ion implanter of a type used to deposit impurities into semiconductor integrated circuits at a high energy of acceleration.

Industries such as the semiconductor manufacturing industry must have ion implanters which are capable of accelerating ions to various energies and directing the accelerated particles onto a semiconductor substrate so as to implant such particles to a desired depth. Such implanters must be capable of generating a gas or vapour of desired particles and then ionizing that gas or vapour so that the resultant particles can be accelerated under the influence of an electric field. The method of producing ions consists of first vapourizing the molecules usually by heating the substance to a desired temperature and then directing the particles to an arc chamber which bombards the neutral particles with electrons to ionize them. The apparatus for vapourizing the substance consists of a cylindrical crucible, usually graphite, which is electrically heated in a high vacuum by passing a current through a resistive wire such as tungsten wrapped around an electrically non-conducting container enclosing the crucible. The substance to be vapourized is placed inside the cylindrical crucible which has a hollow stainless steel tube down its center and heated until its vapour is released. The crucible assembly is at an angle of about 30 degrees. Released vapour enters the stainless steel tube in the interior of the crucible and is allowed to escape out an end of the tube and into an arc chamber.

Commercially available ion sources are generally acceptable for such substances as arsenic and phosphorus which go directly into a vapour phase but are not acceptable for substances such as antimony which go through a liquid phase before releasing vapour. Current crucible designs allow liquid antimony to resolidify in the crucible on the stainless steel vapor feed tube eventually blocking the release of antimony vapor. This condensation occurs primarily after shutting down the apparatus and allowing it to cool. Since the crucibles used to house the substance to be vaporized are expensive and more importantly since changing a crucible involves expensive production line down time, current ion sources are inadequate for such materials. One possible solution is the use of an antimony source material in gaseous form. Unfortunately, such gas presents severe safety problems due to its high toxicity.

Accordingly, it is an object of the invention to provide an improved ion source for an ion implanter. It is a further object to provide an ion source capable of generating antimony vapour from solid or liquid antimony.

SUMMARY OF THE INVENTION

According to the invention there is provided an ion source for an ion implanter which includes a vaporizer and a thermally conductive crucible for housing solid or liquid material to be vaporized having a vapor release aperture therein. A passageway is provided exterior of the crucible for directing vapour from the crucible to the arc chamber. A heater controllably heats the crucible up to a temperature at which vapor of the material to be implanted is formed. The interior of the crucible is of a type of material upon which antimony vapor will not solidify and adhere. Preferably the crucible is made of graphite.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
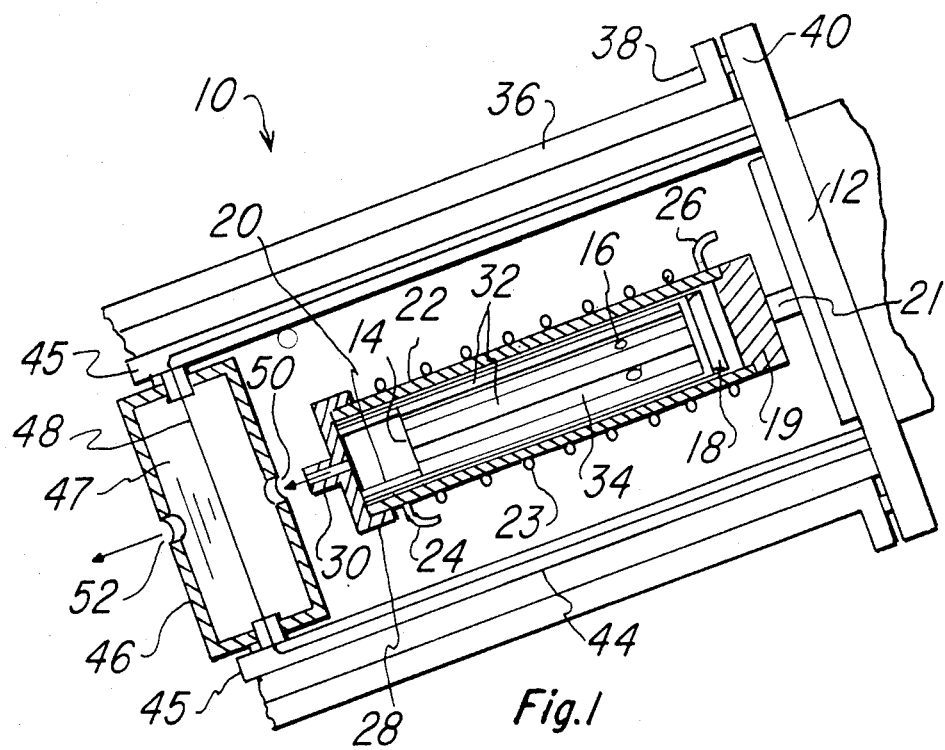
FIG. 1 is a partial sectional view of a vaporizer according to a preferred embodiment of the present invention.
Figures 2, 3:
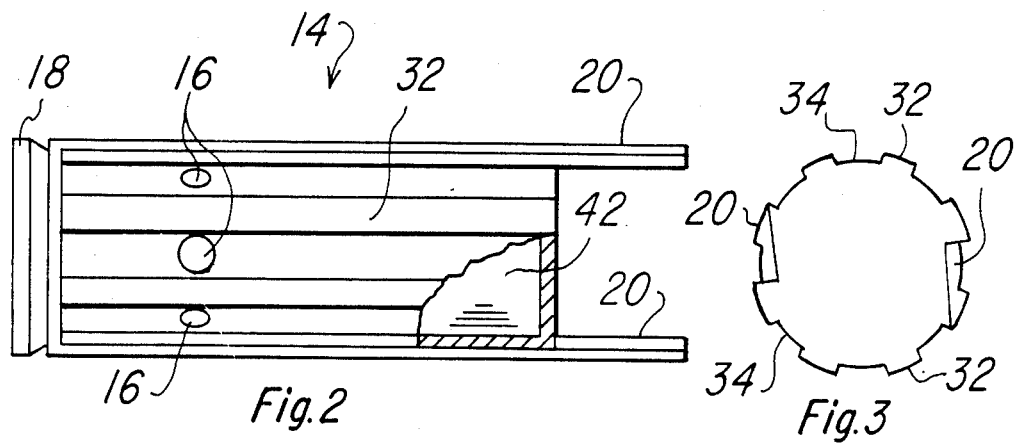
FIG. 2 is side elevation view of the crucible of the vaporizer of FIG. 1.
FIG. 3 is a bottom view of the crucible.

Referring to FIG. 1, there is shown an ion source assembly 10 including a flange 12 to which the assembly is mounted so that it may be inserted inside a housing 36 and sealed to a flange 38 of the latter by means of an O-ring 40. The ion source assembly 10 consists of a cylindrical sleeve 22 made of a high temperature resistant electrically non-conductive material such as boron nitride, a ceramic or other suitable material. A heater wire 23 is helically wound around the sleeve 22 and the ends 24 and 26 of the latter are brought out of the flange 12 through suitable insulating plugs (not shown). The heater wire 23 may be of any material such as tungsten which is capable of reaching the elevated temperatures required for vaporization. A stainless steel nozzle cap 28 having a nozzle 30 is fitted over one end of the sleeve 22. A graphite crucible 14 is slidably fitted into the sleeve 22 so that its legs 20 rest on the nozzle cap 28. A sleeve cap 19 is removably fitted over another end of the sleeve 22 closest to the flange 12.

The graphite crucible 14 has a hollow interior 42 and a plurality of holes 16 for providing fluid communication between the interior and the exterior. The holes 16 are each located in an elongated channel 34 formed on the graphite crucible exterior. Each channel 34 is formed between elongated ridges 32 on the graphite crucible 14. The crucible 14 has a removable cap 18 for inserting and removing material.

An arc chamber 46 having a cylindrical interior 47 is positioned next to the nozzle 30 with an inlet passage 50 in line with the former and an outlet passage 52 also in line with the nozzle 30 and the inlet passage 50. The filament 48 is aligned with the axis of the chamber 47 and is threaded through support posts 45 and through insulating plugs (not shown) in flange 12. The entire heater, crucible and arch chamber structure is at an angle of about 30 degrees when in place permitting the material to be retained at a bottom of the crucible at a level below holes 16.

In operation a small amount of material to be vaporized is loaded into the graphite crucible 14 which is then loaded into the boron nitride sleeve 22 and current is then passed through heater wire 23 to slowly bring the crucible up to the desired temperature. At the same time the interior of housing 36 is evacuated down to a low pressure below 10 exp(−6) torr. Operation of the ionizer is initiated using a suitable carrier gas.

Once the material inside the crucible 14 begins to release vapor the vapor passes through holes 16 and travels down the passageways created by the channels 34 in the graphite crucible 14 in combination with the sleeve 22. Vapor enters the plenum created by the space between the crucible 14 and and the nozzle cap 28 and then enters the nozzle 30. After passing through the nozzle 30 the vapor enters the ionizing chamber 47 where it is bombarded by electrons released from heated wire 48 and then accelerated towards the cylindrical surface of the chamber 46. The resultant vapor ions go through opening 52 and are subsequently accelerated and focussed.

On reducing the heating of the sleeve 22 the graphite crucible 14 cools down thereby reducing the temperature of the material inside below its vapor producing temperature. With antimony used as the vapor producing material, there is no bond created between the antimony and the graphite as there would be between antimony and stainless steel. Thus no clogging of holes 16 occurs. Moreover, because of the relatively small mass of the crucible it is possible to use less time in heating the sleeve 22 and crucible 14.

It has been found that the present crucible is capable of operating with substantially less downtime than conventional ionizers and is able to operate in repeated cycles with antimony unlike conventional units.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. An ion source for an ion implanter, comprising:
   a housing having an orifice at one end, and having a removable cap;
   a graphite crucible disposed within said housing, said crucible having a hollow interior for holding an ion source metal, having a channel formed into and along the side of the crucible, and having a hole for providing fluid communication between the interior and exterior of said crucible, said hole positioned above a portion of the interior in which the ion source metal is to be held, and said hole also positioned within said channel so that the interior of said crucible is in fluid communication with said orifice through said hole and along the side of said crucible in said channel, said crucible removable from said housing when said removable cap is removed therefrom; and
   a heater assembly for heating said crucible to a temperature at which said ion source metal will produce a vapor.

2. An ion source according to claim 1, wherein said housing is formed of electrically non-conductive material;
   and wherein said heater assembly comprises a heater wire wound around said housing for receiving electrical current therethrough.

3. An antimony ion source for an ion implanter, comprising:
   a housing having an orifice at one end, and having a removable cap at another end;
   a graphite crucible disposed within said housing, said crucible having a hollow interior for holding antimony source metal, having a plurality of holes for providing fluid communication between the interior and exterior of said crucible and having a plurality of channels formed on and along an exterior surface of said crucible each of said plurality of holes positioned above the a portion of the interior in which the antimony source metal is to be held and said hole also positioned within one of said channels so that the interior of said crucible is in fluid communication with said orifice through each of said plurality of holes and along the exterior surface of said crucible in corresponding ones of said plurality of channels, said crucible removable from said housing when said removable cap is removed therefrom; and
   a heater assembly disposed around said crucible, for heating said crucible to a temperature at which antimony vaporizes 4. An ion source according to claim 3, wherein said housing is formed of electrically non-conductive material;
   and wherein said heater assembly comprises a heater wire wound around said housing for receiving electrical current therethrough.

5. An ion source according to claim 4, wherein said housing is boron nitride.

6. An ion source according to claim 3, wherein said housing further comprises:
   a sleeve surrounding said crucible, said sleeve formed of an electrically non-conductive material; and
   a nozzle cap at the end of said sleeve opposite from said removable cap, having said orifice disposed therethrough, said nozzle cap formed of stainless steel.

7. An ion source according to claim 4, wherein said crucible has a pair of oppositely disposed legs for spacing said crucible away from said orifice.

* * * * *